(12) United States Patent
Badowski

(10) Patent No.: US 6,878,406 B2
(45) Date of Patent: Apr. 12, 2005

(54) DYNAMIC USE OF PROCESS TEMPERATURE

(75) Inventor: Alfred A. Badowski, Gresham, OR (US)

(73) Assignee: LSI Logic Corporation, Milpitas, CA (US)

(*) Notice: Subject to any disclaimer, the term of this patent is extended or adjusted under 35 U.S.C. 154(b) by 17 days.

(21) Appl. No.: 10/117,487

(22) Filed: Apr. 5, 2002

(65) Prior Publication Data

US 2003/0190496 A1 Oct. 9, 2003

(51) Int. Cl.⁷ .............................................. C23C 16/40
(52) U.S. Cl. ........................ 427/255.26; 427/255.29; 427/255.394; 427/255.4
(58) Field of Search ..................... 427/255.26, 255.394, 427/255.29, 255.4

(56) References Cited

U.S. PATENT DOCUMENTS

| | | | | |
|---|---|---|---|---|
| 5,244,831 A | * | 9/1993 | Hindman et al. ........... | 438/560 |
| 5,840,368 A | * | 11/1998 | Ohmi ....................... | 427/255.4 |
| 6,211,081 B1 | * | 4/2001 | Mikata ...................... | 438/680 |
| 6,296,709 B1 | * | 10/2001 | Krivokapic ................. | 118/697 |
| 6,387,777 B1 | * | 5/2002 | Hurley ...................... | 438/439 |

OTHER PUBLICATIONS

Pierson, Handbook of Chemical Vapor Deposition (1992), pp. 225 and 232.*

* cited by examiner

Primary Examiner—Timothy Meeks
(74) Attorney, Agent, or Firm—Barnes & Thornburg

(57) ABSTRACT

A process for reacting a gaseous species with a substrate includes placing the substrate in a space, heating the space, introducing the gaseous species into the space, and cooling the space. Introducing the gaseous species into the space includes introducing the gaseous species into the space before the substrate reaches a steady state temperature and/or reacting the gaseous species with the substrate includes reacting the gaseous species with the substrate while cooling the space.

16 Claims, 2 Drawing Sheets

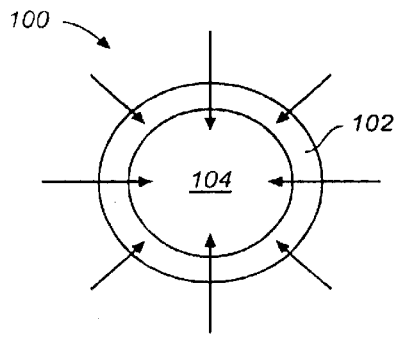
FIG._1
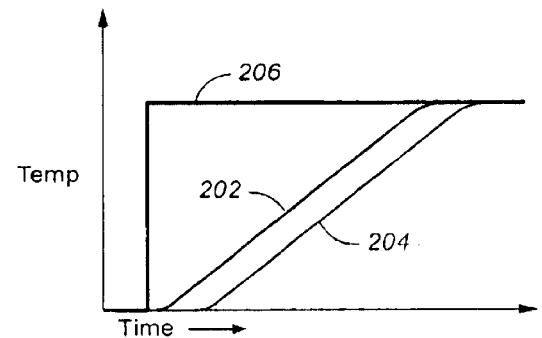
FIG._2
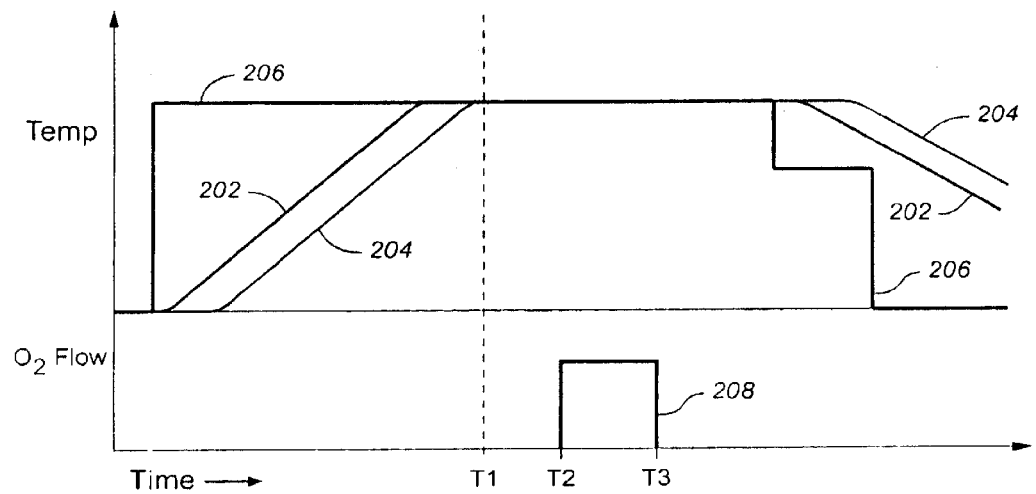
FIG._3 (PRIOR ART)

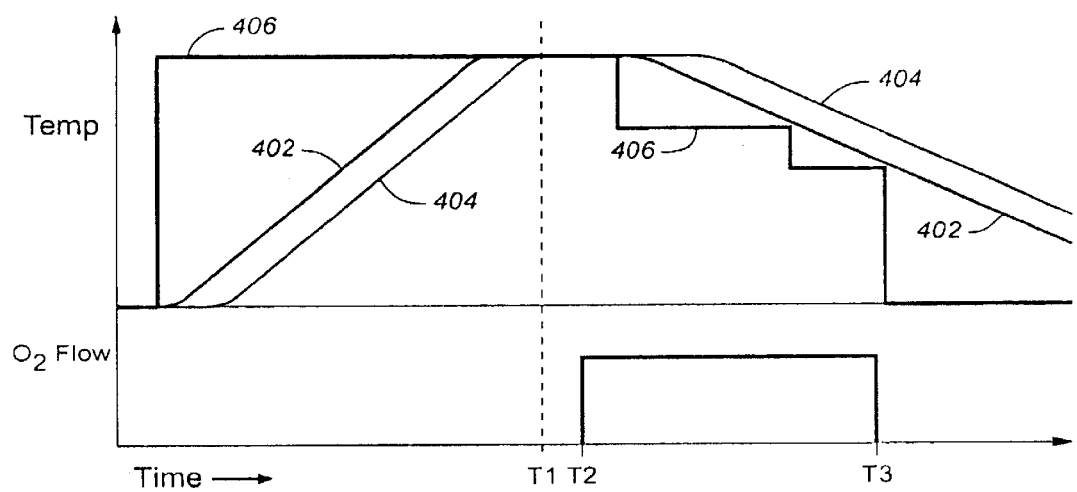
FIG._4
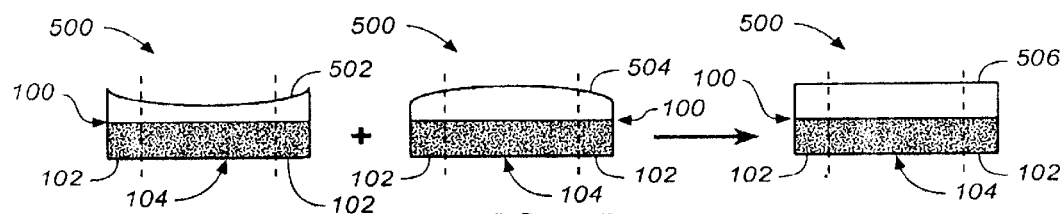
FIG._5
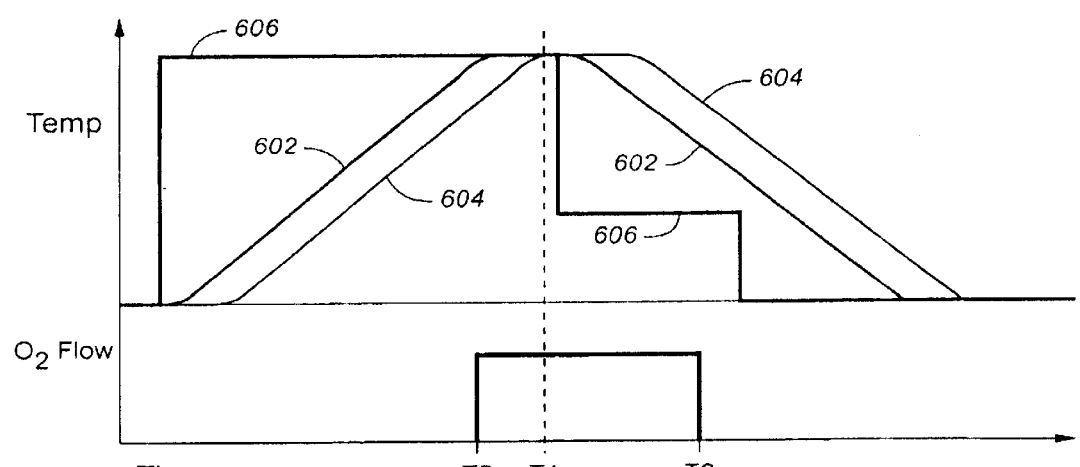
FIG._6

DYNAMIC USE OF PROCESS TEMPERATURE

FIELD OF THE INVENTION

This invention relates to the reaction of species with atoms and/or molecules at and adjacent the surfaces of substrates. It is disclosed in the context of the reaction of gaseous species with silicon substrates that are exposed to the gaseous species, such as, for example, oxidation, nitriding, or the like, but is believed to be useful in other applications as well.

BACKGROUND OF THE INVENTION

Currently, processes for the production of, for example, oxide films, nitride films, and the like, on silicon substrates promote film thickness uniformity through the provision of excess thermal "soak" time prior to the introduction of the gaseous species, oxygen or nitrogen for example, into the furnace where the silicon wafers are to be treated, for example, oxidized or nitrided. The oxidizing, nitriding, or the like process takes place after the furnace has reached steady state temperature and the wafers have soaked at the steady state temperature for a time. The extra soak time is required for the entire surface of the wafers to reach steady state temperature. While this extra soak time promotes uniformity of the process layer thickness, it dramatically increases the process time, resulting in lower process throughput. An attempt to shorten process times for known processes compromises film thickness uniformity. In the prior art, some trade-off between process throughput and film thickness uniformity was achieved. However, it will be readily appreciated that any attempt to improve process throughput negatively impacted film thickness uniformity. Conversely, any attempt to improve film thickness uniformity negatively impacted process throughput. Furthermore, the ability to achieve a true steady state condition is limited by the capability of the furnace and its temperature control system.

Efforts to reduce process time and increase process throughput while at the same time improving across-wafer film thickness uniformity in diffusion furnaces continue. It would be desirable to reduce the reliance of the process on the steady state temperature condition.

SUMMARY OF THE INVENTION

According to an aspect of the invention, a process for reacting a first gaseous species with a substrate includes placing the substrate in a space, heating the space to a first temperature, introducing the first gaseous species into the space, and cooling the space from the first temperature. The process includes either introducing the first gaseous species into the space before the substrate reaches the first temperature or reacting the first gaseous species with the substrate while cooling the space.

According to another aspect of the invention, a process for reacting a first gaseous species with a substrate having a central region and an edge region includes placing the substrate in a space, heating the space to a first temperature, introducing the first gaseous species into the space, and cooling the space from the first temperature. Introducing the first gaseous species into the space includes introducing the first gaseous species into the space before the temperatures of the central region and the edge region are approximately uniform, or the first gaseous species continues to react with the substrate while the space is cooling so that the central region and the edge region of the substrate are approximately uniformly reacted with the gaseous species.

Illustratively according to these aspects of the invention, the process includes both introducing the first gaseous species into the space before the substrate reaches the first temperature and reacting the first gaseous species with the substrate while cooling the space.

Further illustratively according to these aspects of the invention, introducing the first gaseous species into the space includes introducing oxygen into the space.

Additionally illustratively according to these aspects of the invention, the process includes introducing a second gaseous species into the space to react with the first gaseous species in the space.

Illustratively according to these aspects of the invention, introducing the first gaseous species into the space includes introducing oxygen into the space and introducing the second gaseous species into the space includes introducing hydrogen into the space.

Illustratively according to these aspects of the invention, introducing the first gaseous species into the space includes introducing nitrogen into the space.

Illustratively according to these aspects of the invention, heating the space to a first temperature includes commanding the temperature of the space to increase in a single step to the first temperature. Cooling the space from the first temperature includes commanding the temperature of the space to decrease in a single step from the first temperature to a second temperature.

Further illustratively according to these aspects of the invention, cooling the space from the first temperature further includes commanding the temperature of the space to decrease in a single step from the second temperature to a third temperature.

Additionally illustratively according to these aspects of the invention, cooling the space from the first temperature further includes commanding the temperature of the space to decrease in a single step from the third temperature to a fourth temperature.

According to another aspect of the invention, a reacted substrate is made by placing a substrate to be reacted in a space, heating the space to a first temperature, introducing a first gaseous species into the space, and cooling the space from the first temperature. Introducing the first gaseous species into the space includes introducing the first gaseous species into the space before the substrate reaches the first temperature, or cooling the space from the first temperature includes reacting the first gaseous species with the substrate while cooling the space.

Illustratively according to this aspect of the invention, the reacted substrate is made by both introducing the first gaseous species into the space before the substrate reaches the first temperature and reacting the first gaseous species with the substrate while cooling the space.

BRIEF DESCRIPTION OF THE DRAWINGS

The invention may best be understood by referring to the following detailed description and accompanying drawings which illustrate the invention. In the drawings:

FIG. 1 illustrates a characteristic of substrates during their heating and cooling;

FIG. 2 illustrates a step in the processing of substrates, and the substrates' response to the step;

FIG. 3 illustrates steps in the prior art processing of substrates, and the substrates' response to those steps;

FIG. 4 illustrates steps in the processing of substrates according to an embodiment of the invention, and the substrates' response to those steps;

FIG. 5 illustrates highly diagrammatic sectional side elevational views of substrates processed according to the process illustrated in FIG. 4; and, FIG. 6 illustrates steps in the processing of substrates according to an embodiment of the invention, and the substrates' response to those steps.

DETAILED DESCRIPTION OF THE DRAWINGS

Referring now particularly to FIG. 1, prior art processes for the production of layers or films, for example, oxide films, nitride films, and the like, on or in silicon substrates promote film thickness uniformity as follows. For purposes of illustration only, dry oxidation will be described in the following illustrative examples.

In FIG. 1, an illustrative silicon substrate is shown as silicon wafer 100. Silicon wafer 100 is placed in a furnace (not shown) of any type known in the art. The furnace is driven to a first temperature set point 206 at a first ramp rate, and subsequently driven to one or more "cooling' temperatures at one or more other ramp rates, as illustrated in FIG. 2. In this illustrative example, the ramp rate is a linear ramp from an initial temperature to a setpoint temperature, although other rates could be used. The temperature of wafer 100 ramps up at a rate controlled by the furnace controller to the temperature setpoint. However, the temperature of wafer 100 does not increase uniformly. As illustrated in FIGS. 1 and 2, the temperature of the central region 104 of wafer 100 increases more slowly than the temperature of the edge region 102 of wafer 100.

This non-uniform heating is illustrated graphically in FIG. 2, where the temperature with respect to time of central region 104 is illustrated as plot line 204, and the temperature with respect to time of edge region 102 is illustrated as plot line 202. As can be seen from FIG. 2, the temperature increase with respect to time of central region 104 lags the temperature increase with respect to time of edge region 102 during the temperature ramp up. Conversely, the temperature decrease with respect to time of central region 104 lags that of edge region 102 during the temperature ramp down.

Referring now to FIG. 3, an illustrative prior art process of dry oxidation promoted film thickness uniformity by achieving temperature uniformity across the surface of wafer 100 prior to the introduction of the gaseous species (oxygen in this example) into the furnace where wafer 100 is to be treated. The process for achieving temperature uniformity across the surface of wafer 100 is illustrated in FIG. 3. At time T1 temperature uniformity appears to have been reached between edge region 102 and central region 104 of wafer 100.

However, even after uniformity appears to have been achieved between edge region 102 and central region 104 of wafer 100, it is necessary to soak the wafer 100 at the steady state temperature, because a temperature difference of even 0.5 degree Celsius between edge region 102 and central region 104 of wafer 100 is sufficient to affect the uniformity of the oxidation layer. Therefore, only after wafer 100 has been soaked at the steady state temperature, and temperature uniformity across the surface of wafer 100 is assured, is the gaseous species, oxygen in this illustrative example, introduced into the furnace. Plot line 208 illustrates the flow rate of $O_2$ into the furnace. As can been seen in FIG. 3, oxygen is introduced at time T2, well after the steady state temperature is achieved at T1. Oxygen is subsequently evacuated from the furnace at time T3, during steady state temperature operation of the furnace, and well before the controlled ramp down portion of the temperature profile. Again, this is because oxidation uniformity is heavily dependent upon maintaining steady state temperature conditions throughout the reaction.

In prior art processes, the soak time required for wafer 100 to achieve uniform temperature increases the overall process time, resulting in lower furnace throughput. Any attempt to shorten the process time compromises film thickness uniformity. In the prior art, some trade-off between process throughput and film thickness uniformity was achieved, whereby acceptable film thickness uniformity was achieved with a sufficiently slow process speed. However, it will be readily appreciated that any attempt to improve process speed negatively impacted film thickness uniformity. Conversely, any attempt to improve film thickness uniformity negatively impacted process speed.

Turning now to FIG. 4, an illustrative embodiment of a process for the production of layers (films) on silicon substrates in accordance with the present invention will now be described. In FIG. 4, an oxide film-forming process is characterized by ramping up under the control of a temperature controller to a temperature setpoint 406. The temperature with respect to time of central region 104 of wafer 100 is illustrated as plot line 404, and the temperature with respect to time of edge region 102 of wafer 100 is shown as plot line 402. As was the case in the prior art method illustrated in FIG. 3, the furnace is driven to a first temperature set point at a first ramp rate, and later driven stepwise to a one or more cooling temperatures. As was the case in FIG. 2, the temperature with respect to time of central region 104 lags the temperature with respect to time of edge region 102, and temperature uniformity is achieved for edge region 102 and central region 104 of wafer 100 at time T1.

However, unlike the prior art process illustrated in FIG. 2, in the process illustrated in FIG. 4, the gaseous species, oxygen in this example, is introduced into the furnace without soaking wafer 100 at the steady state temperature. Furthermore, oxygen continues to be supplied, and oxidation continues, during the ramp down portion of the temperature profile. Even though from the prior art one would expect that this process would yield a non-uniform oxide layer, in fact this process yields an oxide layer having a uniformity equal or superior to the prior art process illustrated in FIG. 2. This is because commanded temperature profile 406 is formulated to compensate for oxide thickness differences between central region 104 and edge region 102 of wafer 100, as explained in more detail below with reference to FIG. 5.

As illustrated on the left hand side in FIG. 5, early in the steady state portion of substrate 100 temperature profile, oxide film 500 forms more rapidly in edge region 102 than in central region 104, resulting in a thicker oxide in edge region 102 than in central region 104. This uneven oxide growth is illustrated as a concave film 502. Conversely, during the ramp down portion of the substrate temperature profile, oxide film 500 forms more rapidly in central region 104 as it cools more slowly than in the more rapidly cooling edge region 102. This results in a thicker oxide being formed during this time interval in central region 104 than in edge region 102. This is illustrated as a convex film 504. Temperature profile 406 is tailored so that the net effect, the sum of the uneven film deposits 502 and 504, or more accurately, the integral of the oxide formation rates over all of the time that oxidation is taking place in the furnace, result in a substantially even thickness film 506.

FIGS. 4 and 5 illustrate the effects of dynamically changing the temperature conditions in a diffusion furnace in order to achieve substantially even film thickness without using a thermal soak time. Oxidation occurs under dynamic temperature conditions which are tailored for optimum film thickness uniformity. The principles of heat transfer govern the specifics of the dynamic temperature profile 406 that will produce the best uniformity results in any given furnace under any given conditions.

Importantly, the process illustrated and described with reference to FIGS. 4 and 5 requires minimal additional capital investment or no additional capital investment in diffusion furnaces to implement, since what is being done is controlling the processing temperature profile in the furnace, which may be an existing furnace. Equally importantly, however, is that the dynamic temperature profile control being implemented according to the invention promotes greater throughput in an existing diffusion furnace having the same capacity, or the same throughput using, for example, lower capacity diffusion furnace than could be achieved using prior art temperature control. At the same time, product quality is enhanced.

FIG. 6 illustrates another embodiment of a process for the production of layers on silicon substrates in accordance with the present invention. In FIG. 6, a temperature profile 606 of an oxide film-forming process is illustrated. In FIG. 6, the temperature with respect to time of the central region 104 of wafer 100 is illustrated by plot line 604, and the temperature with respect to time of the edge region 102 of wafer 100 is illustrated by plot line 602. As was the case in the embodiment illustrated in FIG. 4, temperature uniformity is achieved for edge region 102 and central region 104 of wafer 100 at time T1.

However, unlike the embodiment illustrated in FIG. 4, in the process illustrated in FIG. 6 the gaseous species, oxygen, is introduced into the furnace at time T2, before time T1 and thus before wafer 100 achieves steady state temperature. Again, as in the embodiment illustrated in FIG. 4, in the process illustrated in FIG. 6 oxidation continues after the ramp down portion of temperature profile 606. However, in the process illustrated in FIG. 6 the ramp down is at a higher rate in order to yield optimal uniformity results.

Again, as is the case with temperature profile 406, temperature profile 606 is tailored to compensate for differences in the rates at which oxidation occurs between central region 104 and edge region 102 of wafer 100. In this case, during the ramp up portion of temperature profile 606, oxidation film 500 is deposited much more rapidly in the edge region 102 than in the central region 104. Therefore, wafer 100 is permitted to cool more quickly to permit the oxide development in central region 104 to "catch up" with the edge region 102.

Of course, for the process illustrated in FIG. 6, the principles of heat transfer will again govern the specifics of the dynamic temperature profile 606 that will produce optimal uniformity results in any given furnace under any given conditions.

Importantly, the processes described in connection with FIGS. 4–6 for oxidation utilizing dynamic temperature conditions result in superior uniformity to prior art processes. This is because according to the invention the dynamic temperature profile is tailored to the furnace and the process being performed (oxidation, thermal nitriding, nitride film growth, polysilicon film growth, etc.), and therefore provides a means for overcoming the limitations of the furnace.

The examples provided herein are intended to be illustrative, and are not intended to limit the invention claimed herein in any way. Those skilled in the art will recognize that the rate at which the process proceeds has to be slow enough to permit a change in temperature during the process in order to benefit from the invention. This may require the use of other gases, such as nitrogen in the case of an oxidation process, to slow the process during, for example, wet oxidation. Those skilled in the art will realize that the present invention can be used with not only dry oxidation, but also with wet oxidation, nitriding, deposition or reaction with other species, or any other process for the production of layers on silicon substrates where the thickness of the film is related to, and thus controllable, as a function of the temperature of the substrate. Those skilled in the art will realize that the invention may be used in any processing technique in which a film is created on a substrate by a temperature-dependent process. Nothing in this disclosure should be read to limit the invention to anything less.

What is claimed is:

1. In a process for reacting a first gaseous species with a substrate, the process including placing the substrate in a space, heating the space to a first temperature to create a temperature bias in the substrate, introducing the first gaseous species into the space, and cooling the space from the first temperature according to a temperature profile, the temperature profile being designed to compensate for the effect of the temperature bias created during the heating step, the process further including both introducing the first gaseous species into the space before the substrate reaches the first temperature and reacting the first gaseous species with the substrate while cooling the space.

2. The process of claim 1 wherein introducing the first gaseous species into the space includes introducing oxygen into the space.

3. The process of claim 2 further including introducing a second gaseous species into the space to react with the first gaseous species in the space.

4. The process of claim 3 wherein introducing the first gaseous species into the space includes introducing oxygen into the space and introducing the second gaseous species into the space includes introducing hydrogen into the space.

5. The process of claim 1 wherein introducing the first gaseous species into the space includes introducing nitrogen into the space.

6. The process of claim 1 wherein heating the space to a first temperature includes commanding the temperature of the space to increase in a single step to the first temperature, cooling the space from the first temperature includes commanding the temperature of the space to decrease in a single step from the first temperature to a second temperature.

7. The process of claim 6 wherein cooling the space from the first temperature further includes commanding the temperature of the space to decrease in a single step from the second temperature to a third temperature.

8. The process of claim 7 wherein cooling the space from the first temperature further includes commanding the temperature of the space to decrease in a single step from the third temperature to a fourth temperature.

9. A process for reacting a first gaseous species with a substrate having a central region and an edge region, the process including placing the substrate in a space, heating the space to a first temperature to create a temperature bias between the central region and the edge region, introducing the first gaseous species into the space, and cooling the space from the first temperature according to a temperature profile, the temperature profile being designed to compensate for the effect of the temperature bias created during the heating step said process further including both introducing the first gaseous species into the space before the substrate reaches the first temperature and reacting the first gaseous species with the substrate while cooling the space.

10. The process of claim 9 wherein introducing the first gaseous species into the space includes introducing oxygen into the space.

11. The process of claim 10 further including introducing a second gaseous species into the space to react with the first gaseous species in the space.

12. The process of claim 9 wherein introducing the first gaseous species into the space includes introducing oxygen into the space and introducing the second gaseous species into the space includes introducing hydrogen into the space.

13. The process of claim 9 wherein introducing the first gaseous species into the space includes introducing nitrogen into the space.

14. The process of claim 9 wherein heating the space to a first temperature includes commanding the temperature of the space to increase in a single step to the first temperature, and cooling the space from the first temperature includes commanding the temperature of the space to decrease in a single step from the first temperature to a second temperature.

15. The process of claim 14 wherein cooling the space from the first temperature further includes commanding the temperature of the space to decrease in a single step from the second temperature to a third temperature.

16. The process of claim 15 wherein cooling the space from the first temperature further includes commanding the temperature of the space to decrease in a single step from the third temperature to a fourth temperature.

* * * * *